(12) United States Patent
Lin et al.

(10) Patent No.: US 8,062,917 B2
(45) Date of Patent: Nov. 22, 2011

(54) DISPLAY PANEL STRUCTURE AND MANUFACTURE METHOD THEREOF

(75) Inventors: Chun-Nan Lin, Hsin-Chu (TW);
Kuo-Yuan Tu, Hsin-Chu (TW);
Shu-Feng Wu, Hsing-Chu (TW);
Wen-Ching Tsai, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/855,837

(22) Filed: Aug. 13, 2010

(65) Prior Publication Data

US 2011/0014788 A1  Jan. 20, 2011

Related U.S. Application Data

(62) Division of application No. 11/738,718, filed on Apr. 23, 2007, now Pat. No. 7,902,670.

(30) Foreign Application Priority Data

Jul. 7, 2006 (TW) .............................. 95124848 A

(51) Int. Cl.
*H01L 21/00* (2006.01)
(52) U.S. Cl. .................. 438/34; 257/762; 257/E29.147
(58) Field of Classification Search .................... 438/34; 257/762, 741, E29.147
See application file for complete search history.

(56) References Cited

U.S. PATENT DOCUMENTS

| | | | |
|---|---|---|---|
| 5,738,948 A | 4/1998 | Ikeda et al. | |
| 5,959,358 A | 9/1999 | Lanford et al. | |
| 6,111,619 A | 8/2000 | He et al. | |
| 6,165,917 A | 12/2000 | Batey et al. | |
| 6,399,496 B1 | 6/2002 | Edelstein et al. | |
| 6,515,726 B2 | 2/2003 | Chae et al. | |
| 6,562,668 B2 | 5/2003 | Jang et al. | |
| 6,686,661 B1 | 2/2004 | Lee et al. | |
| 6,861,368 B2 | 3/2005 | Chae | |
| 6,872,603 B2 | 3/2005 | Doi | |
| 6,875,559 B2 | 4/2005 | Keller | |
| 7,008,548 B2 | 3/2006 | Chae et al. | |

(Continued)

FOREIGN PATENT DOCUMENTS

JP  2005-166757  8/2010

OTHER PUBLICATIONS

Chinese language Office Action dated Nov. 30, 2007.
English language translation of abstract, relevant parts of specification, and figures for JP 2005-166757.

*Primary Examiner* — Fernando L Toledo
(74) *Attorney, Agent, or Firm* — Thomas, Kayden, Horstemeyer & Risley, LLP

(57) ABSTRACT

A display panel structure having a circuit element disposed thereon and method of manufacture are provided. The display panel includes a substrate and the circuit element disposed on the substrate. The circuit element has a first interface layer and a first conductive layer. Both the first interface layer and the first conductive layer have cooper materials. The material which makes the first interface layer includes a reactant or a compound of the material which makes the first conductive layer. The method for manufacturing includes the following steps: forming a first interface layer on the substrate; forming a first conductive layer on the first interface layer; and etching the first conductive and interface layers to form a pattern. The existence of the first interface reduces the penetration of the first conductive layer on the substrate and improves the adhesive force between the first conductive layer and the substrate.

10 Claims, 9 Drawing Sheets

U.S. PATENT DOCUMENTS

| | | |
|---|---|---|
| 7,094,684 B2 | 8/2006 | Yamazaki et al. |
| 7,289,183 B2 | 10/2007 | Gan et al. |
| 7,586,197 B2 | 9/2009 | Lee et al. |
| 2004/0058527 A1 | 3/2004 | Yamazaki et al. |
| 2004/0142516 A1 | 7/2004 | Lee et al. |
| 2006/0110866 A1 | 5/2006 | Gan et al. |
| 2006/0269729 A1 | 11/2006 | Gan et al. |
| 2007/0013077 A1 | 1/2007 | Lee et al. |

DISPLAY PANEL STRUCTURE AND MANUFACTURE METHOD THEREOF

CROSS-REFERENCE TO RELATED APPLICATIONS

This application is a divisional of pending U.S. application Ser. No. 11/738,718 filed Apr. 23, 2007 now U.S. Pat. No. 7,902,670, which claims the benefit from the priority of Taiwan Patent Application No. 95124848 filed on Jul. 7, 2006, the disclosures of which are incorporated by reference herein in their entirety.

BACKGROUND OF THE INVENTION

1. Field of the Invention

The present invention generally relates to a structure and manufacture method of display panel. More particularly, the present invention relates to a structure and manufacture method of display panel with circuit elements.

2. Description of the Prior Art

By highly developed technology in the modern society, the demand of the video-audio enjoyment for the consumers is increasing day after day. Because of the fast development of new technology, the principle issue to design the display device is to increase the display size. Especially in the field of liquid crystal display (LCD) panel, how to increase the display size of the panel is an important issue in the manufacture industries.

When the display size of LCD panel is increased, the conventional impedance made of aluminum or aluminum alloy is too large. In order to reduce the impedance value, the silver or copper is used to be the alternative material in the design. However, the cost of silver is too expensive and it is causing the product made of silver lose its competitiveness in the market industry. Therefore, the copper is the only one choice to be the alternative material. However, there are some limitations and problems by using copper to be the alternative material. At first, the adhesive force between the copper and the glass substrate or the plastic substrate is not strong enough, and then the copper film formed over the substrate is easy to peel off. Besides, because the diffusivity of the copper is too large, the copper is easy to penetrate into the substrate when it is deposited onto the substrate, which greatly affects the quality of the LCD.

The adhesive tests described above include a tape test and a pin pull-off test. In the tape test, the film formed over the substrate is cut into 100 small squares by a knife and a specific industry certified tape is taped onto the film and then pulled off quickly. The test result is to calculate the number of squares pulled off by the tape and determine the level of the adhesive force between the film and the substrate. Generally, the desired value of the number of the squares pulled off by the tape is less than 5% of total number of the squares. The pin pull-off test is to stick the probe with certain contacted area onto the film formed over the substrate and secure the substrate. Then, the probe is used to pull the film. The test result is to detect the tension force when any damages are occurred. Generally, if the tension force is more than 200 Newton force, the adhesive force between the firm and the substrate is better.

As shown in FIG. 1, in order to overcome the drawbacks described above, an isolated layer 20 is formed between a substrate 10 and a copper film 30. The isolated layer 20 is disposed to enhance the adhesive force between the copper film 30 and the substrate 10 and pass the adhesive test. When the deposition is in processing, the isolated layer 20 efficiently reduces the diffusion speed of the copper elements.

However, the process of the isolated layer 20 will complicate the whole manufacture process and increase the cost of time and money. Besides, when doing the etching process, because of the different materials used on the isolated layer 20 and the copper film 30, different etching processes are needed to use. The etching problem of the existing residue will occur and the tolerance percentage of the product will decrease.

SUMMARY OF THE INVENTION

The purpose of the present invention is to provide a structure and a manufacture method of a display panel including a gate conductive layer with a low impedance value.

Another purpose of the present invention is to provide a structure and a manufacture method of display panel including a copper film with good adhesive force.

The other purpose of the present invention is to provide a structure and manufacture method of display panel including simple manufacture process steps.

The structure of the display panel of the present invention includes a substrate/substrates and circuit elements. The circuit elements include a first interface layer and a first conductive layer. In the preferred embodiment, the first interface layer is directly formed over the internal surface of the substrate. In a different embodiment, the first interface layer is formed over the metal or nonmetal layer on the internal surface of the substrate. The material of the first interface layer includes copper oxygen solid solution, copper nitrogen solid solution, copper nitrogen-oxygen solid solution, copper alloy oxygen solid solution, copper alloy oxygen-nitrogen solid solution, copper oxide compound, copper alloy oxide compound, copper nitrogen compound, copper alloy nitrogen compound, copper nitrogen-oxygen mixture and/or copper alloy nitrogen-oxygen mixture.

The first conductive layer is formed over the first interface layer. The material of the first conductive layer is copper or copper alloy. Besides, the material of the first interface layer at least includes a reactant or a compound formed the first conductive layer. Because the materials of the first interface layer and the first conductive layer have common compositions, only one etching process is used to etch the first interface layer and the first conductive layer at the same time. By disposing the first interface layer, the problem of diffusing the first conductive layer into the substrate can be improved when the first conductive layer is formed. In addition, the existence of the first interface layer is able to enhance the adhesive force between the first conductive layer and the substrate and improve the problem of the first conductive layer peeling off from the substrate.

In the preferred embodiment, the circuit element forms a-Si thin-film-transistor (a-Si TFT) and further includes an isolated layer, a semiconductor layer, an ohm contacted layer, a source electrode and a drain electrode. The isolated layer covers the gate electrode formed by the first conductive layer and the first interface layer and covers the internal surface exposed in two ends of the first interface layer. The semiconductor layer covers the isolated layer and is opposite to the gate electrode formed by the first interface layer and the first conductive layer. The ohm contacted layer includes a source ohm contacted layer and a drain ohm contacted layer. The source ohm contacted layer and the drain ohm contacted layer are respectively connected to two ends of the semiconductor layer. The source electrode covers the source ohm contacted layer and the drain electrode covers the drain ohm contacted layer.

The manufacture method of the present invention includes the following steps: forming a first interface layer on a substrate and the materials of the first interface layer include copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture and then forming a first conductive layer on the first interface layer. The materials of the first conductive layer include copper or copper alloy and the material of the first interface layer includes reactant or compound formed the first conductive layer and finally etching the first conductive layer and the interface layer to form an etching pattern.

In the preferred embodiment, there are several steps in forming the first interface layer, which include stimulating a substrate material in a chamber to generate an extricated material with copper or copper alloy; inputting and stimulating a reactive gas including nitrogen, oxygen, and/or nitrogen-oxygen mixture in the chamber to generate an extricated gas; and attracting a composition of the extricated material and the extricated gas to deposit on the substrate and form the first interface layer; the composition includes a solid solution or a compound formed by the extricated material and the extricated gas.

DETAILED DESCRIPTION OF THE PREFERRED EMBODIMENT

A structure and manufacture method of display panel is disclosed in the present invention. In the preferred embodiment, the structure of the display panel presented here is a liquid crystal display (LCD) panel. However, in a different embodiment, the structure of the display panel is an organic light emitting diode (OLED) LCD panel or other display device.

Figure 1:
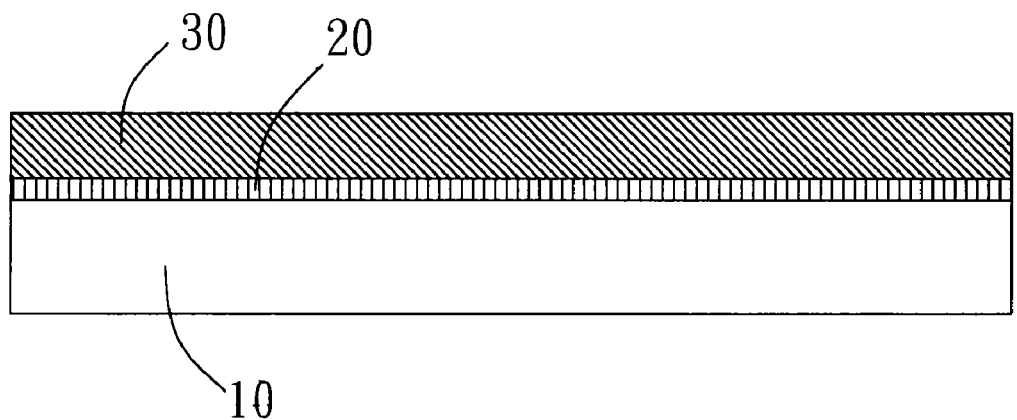
FIG. 1 shows a conventional display panel and a thin-film-transistor (TFT).
Figure 2:
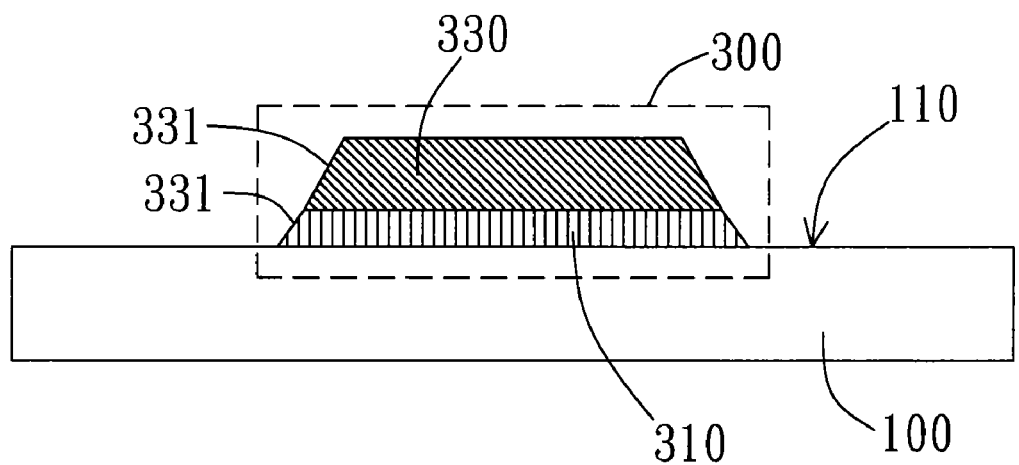
FIG. 2 illustrates an embodiment of a display panel in the present invention.

FIG. 2 illustrates an embodiment of the present invention showing a display panel structure. In the embodiment, the display panel structure includes a substrate 100 and a circuit element 300. The substrate 100 is a substrate preferably made of glass. In a different embodiment, the substrate 100 is a substrate made of polymer, such as plastic substrate. Besides, the circuit element 300 includes transistor, such as a-Si thin-film-transistor (a-Si TFT) or p-Si TFT. In a different embodiment, the circuit element 300 is a metal-insulator-metal thin-film-diode (MIM-TFD).

The circuit element 300 includes a first interface layer 310 and a first conductive layer 330. As shown in FIG. 2, the first interface layer 310 is directly formed over the internal surface 110 of the substrate 100. In a different embodiment, the first interface layer 310 is formed over a metal layer or a nonmetal layer of the internal surface of the substrate 100. Besides, in the preferred embodiment, the first interface layer 310 is formed over the substrate 100 by physical vapor deposition (PVD), such as sputtering process. In a different embodiment, the first interface layer 310 is formed over the substrate 100 by chemical vapor deposition (CVD) or other methods.

In the preferred embodiment, the first interface layer 310 is about 1 nm to 100 nm thick. In a different embodiment, the first interface layer 310 is about 3 nm to 50 nm thick. The materials of the first interface layer 310 include copper oxygen solid solution, copper nitrogen solid solution, copper nitrogen-oxygen solid solution, copper alloy oxygen solid solution, copper alloy oxygen-nitrogen solid solution, copper oxygen compound, copper alloy oxygen compound, copper nitrogen compound, copper alloy nitrogen compound, copper nitrogen-oxygen mixture and/or copper alloy nitrogen-oxygen mixture. The first interface layer 310 is made of the combination of the materials described above. Besides, the material of the copper alloy includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of copper included in copper alloy is more than 50 mol %. In a different embodiment, the percentage of copper included in copper alloy is more than 90 mol %. The first interface layer 310 is electrically conducted or electrically insulated according to different materials and the percentages of the copper.

As shown in FIG. 2, the first conductive layer 330 is directly formed over the first interface layer 310. The first interface layer 310 and the first conductive layer 330 are together formed an etching pattern. In the preferred embodiment, the first conductive layer 330 is formed over the first interface layer 310 by physical vapor deposition (PVD), such as sputtering process. In a different embodiment, the first conductive layer 330 is formed over the first interface layer 310 by chemical vapor deposition (CVD) or other method.

In the preferred embodiment, the material of first conductive layer 330 is copper or copper alloy. The material of the first conductive layer 330 at least comprises reactant or compound formed the first interface layer 310. In other words, the material formed the first interface layer 310 is formed by reacting or compounding the materials of first conductive layer 330 with other elements. For example, when the first conductive layer 330 is formed by copper, the first interface layer 310 is made of reacting or compounding copper with oxygen ion, nitrogen ion or mixture of oxygen ion and/or nitrogen ion. Because the materials of the first interface layer 310 and the first conductive layer 330 have common compositions, the etching step can etch the first interface layer 310 and the first conductive layer 330 at the same time. Besides, in the preferred embodiment, the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of the copper included in the copper alloy is more than 50 mol %. In a different embodiment, the percentage of the copper included in the copper alloy is more than 90 mol %.

Figure 3A:
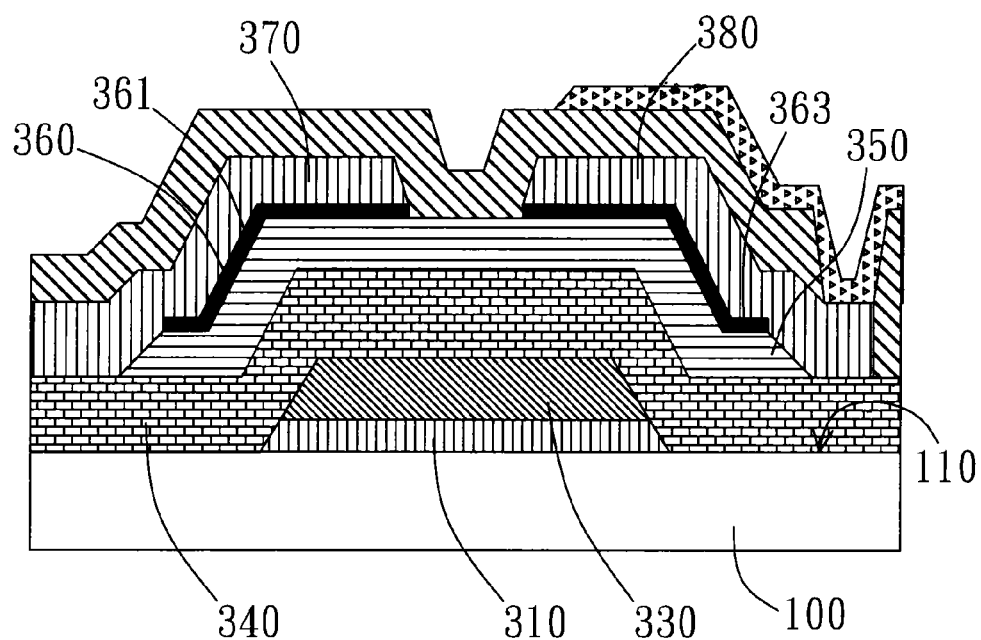
FIG. 3a illustrates an embodiment of the present invention applied in a-Si TFT.

As the embodiment shown in FIG. 3a, the circuit element 300 is a-Si TFT and used in a bottom gate electrode design. In this embodiment, the etching pattern formed together by the first interface layer 310 and the first conductive layer 330 is used to be the gate electrode of the circuit element 300. The circuit element 300 further comprises an isolated layer 340, a semiconductor layer 350, an ohm contacted layer 360, a source electrode 370 and a drain electrode 380. The isolated layer 340 covers the gate electrode by forming the first conductive layer 330 and the first interface layer 310 and covers the internal surface 110 of the substrate 100 exposed at the two ends of the first interface layer 310. In the preferred embodiment, the isolated layer 340 is made of oxygen silicon compound or nitrogen silicon compound.

The semiconductor layer 350 covers the isolated layer 340. After the etching process, the etching pattern of the semiconductor layer 350 is opposite to the gate electrode formed by the first conductive layer 330 and the first interface layer 310. In this preferred embodiment, the semiconductor layer 350 is a-Si layer. The ohm contacted layer 360 includes a source ohm contacted layer 361 and a drain ohm contacted layer 363. The source ohm contacted layer 361 and the drain ohm contacted layer 363 are respectively connected to two ends of the semiconductor layer 350. In other words, the source ohm contacted layer 361 and the drain ohm contacted layer 363 are respectively opposite to two ends of the gate electrode formed by the first conductive layer 330 and the first interface layer 310. In the preferred embodiment, the ohm contacted layer 360 is n+a-Si layer. The source electrode 370 covers the source ohm contacted layer 361. The drain electrode 380 covers the drain ohm contacted layer 363. The source electrode 370 and the drain electrode 380 are metal layers deposited after etching.

Because of disposing the first interface layer 310, the problem of the first conductive layer 330 diffusing into the substrate 100 can be improved when the first conductive layer 330 is formed over the substrate 100. Besides, the existence of the first interface layer 310 can enhance the strength of the adhesive force between the first conductive layer 330 and the substrate 100. The problem of the first conductive layer 330 peeling off from the substrate 100 can be improved.

Figure 3B:
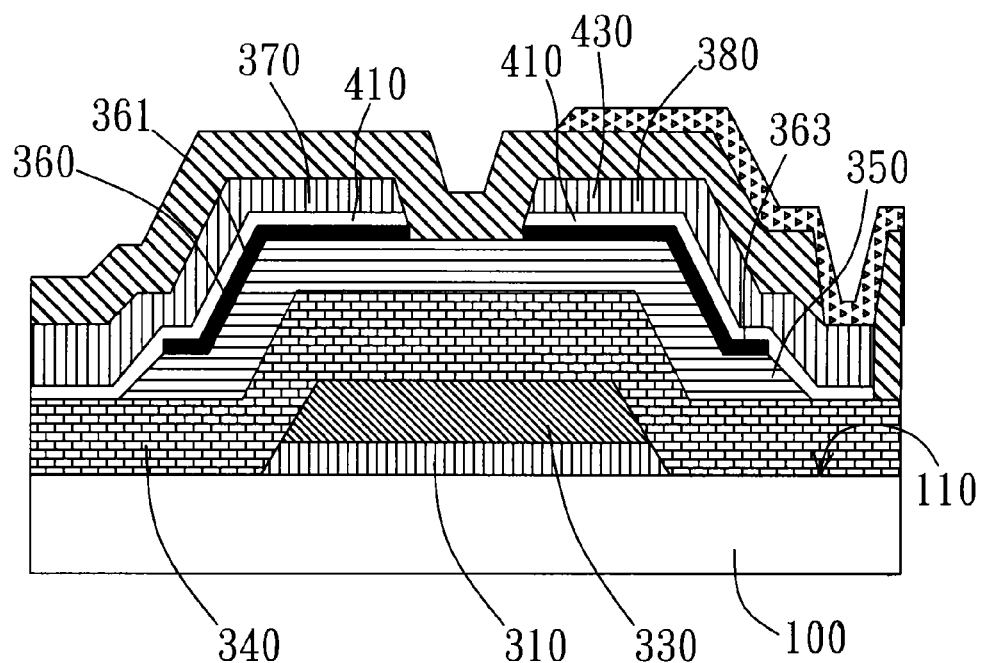
FIG. 3b shows another embodiment of the present invention applied in a-Si TFT.

FIG. 3b is another embodiment of a-Si TFT made of the bottom gate design. In this embodiment, the source electrode 370 and the drain electrode 380 respectively include a second interface layer 410 and a second conductive layer 430. The second interface layer 410 is in the bottom of the source electrode 370 and the drain electrode 380 and formed over the ohm contacted layer 360. The material of the second interface layer 410 includes copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture. Besides, in the preferred embodiment, the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of copper included in copper alloy is more than 50 mol %. In a different embodiment, the percentage of copper included in copper alloy is more than 90 mol %. The second interface layer 410 is electrically conducted or electrically insulated according to different materials and the percentages of the copper. The limitation of the thickness of the second interface layer 410 is close to the thickness of the first interface layer 310.

The second conductive layer 430 is directly formed over the second interface layer 410. The second interface layer 410 and the second conductive layer 430 are together formed an etching pattern. In the preferred embodiment, the second conductive layer 430 is formed over the second interface layer 410 by physical vapor deposition (PVD), such as sputtering process. In a different embodiment, the second conductive layer 430 is formed over the second interface layer 410 by chemical vapor deposition (CVD) or other method.

In the preferred embodiment, the material of the second conductive layer 430 is copper or copper alloy. The material of the second interface layer 410 at least comprises reactant or compound forms the second conductive layer 430. In other words, the material of the second interface layer 410 is formed by reacting or compounding the material of second conductive layer 430 with other elements. For example, as the second conductive layer 430 is made of copper, the second interface layer 410 is made of reacting or compounding copper with oxygen, nitrogen or mixture of oxygen and nitrogen. Because of the commonness of the materials of the second interface layer 410 and the second conductive layer 430, the etching step can etch the second interface layer 410 and the second conductive layer 430 at the same time. Besides, in the preferred embodiment, the material of the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of copper included in copper alloy is more than 50 mol %. In a different embodiment, the percentage of copper included in copper alloy is more than 90 mol %.

Figure 3C:
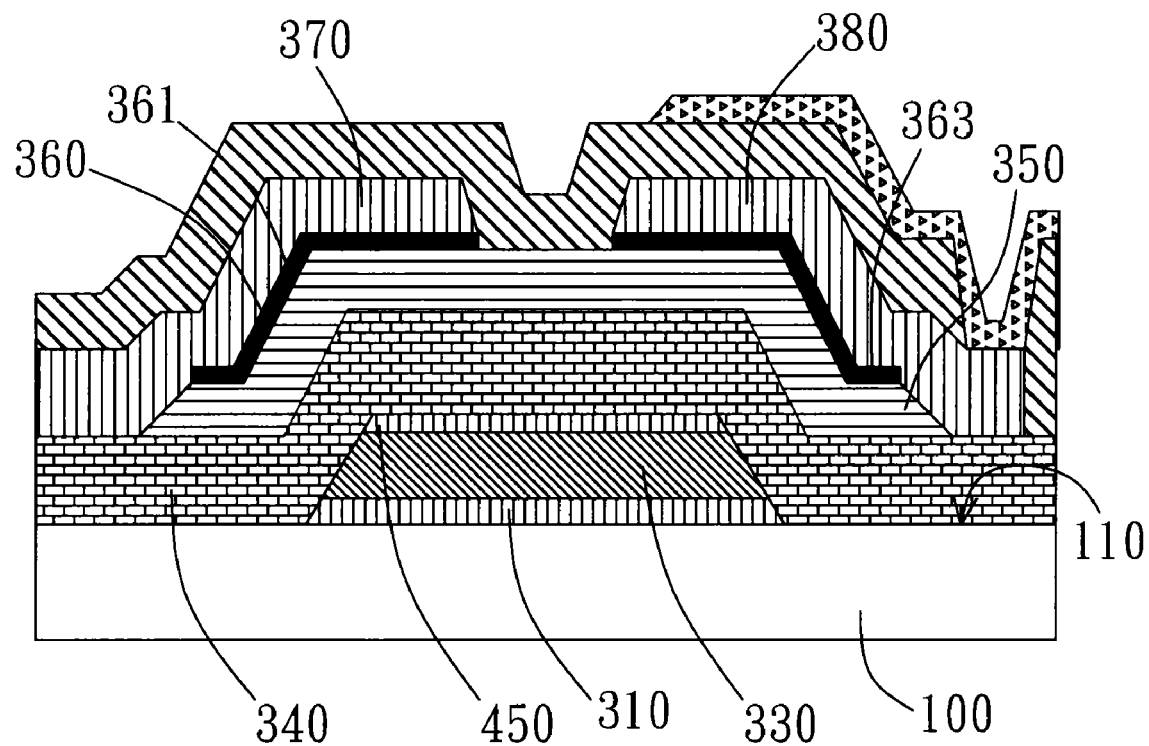
FIG. 3c is another embodiment of a-Si TFT made of the bottom gate design.

FIG. 3c is another embodiment of a-Si TFT made of the bottom gate design. In this embodiment, the third interface layer 450 is formed between the first conductive layer 330 and the isolated layer 340. The third interface layer 450 is directly formed over the first conductive layer 330. The method to form the third interface layer 450 is used by PVD, CVD and so on. The isolated layer 340 is directly formed over the third interface layer 450. The top end and the bottom end of the third interface layer 450 are respectively connected to the isolated layer 340 and the first conductive layer 330. Because of disposing the third interface layer 450, the adhesive force between the first conductive layer 330 and the isolated layer 340 is increased.

The material of the third interface layer 450 includes copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture. It should be noted that the material of the third interface layer 450 at least comprises reactant or compound formed the first conductive layer 330. In other words, the material of the third interface layer 450 is formed by reacting or compounding the material of the first conductive layer 330 with other elements.

Figure 4A:
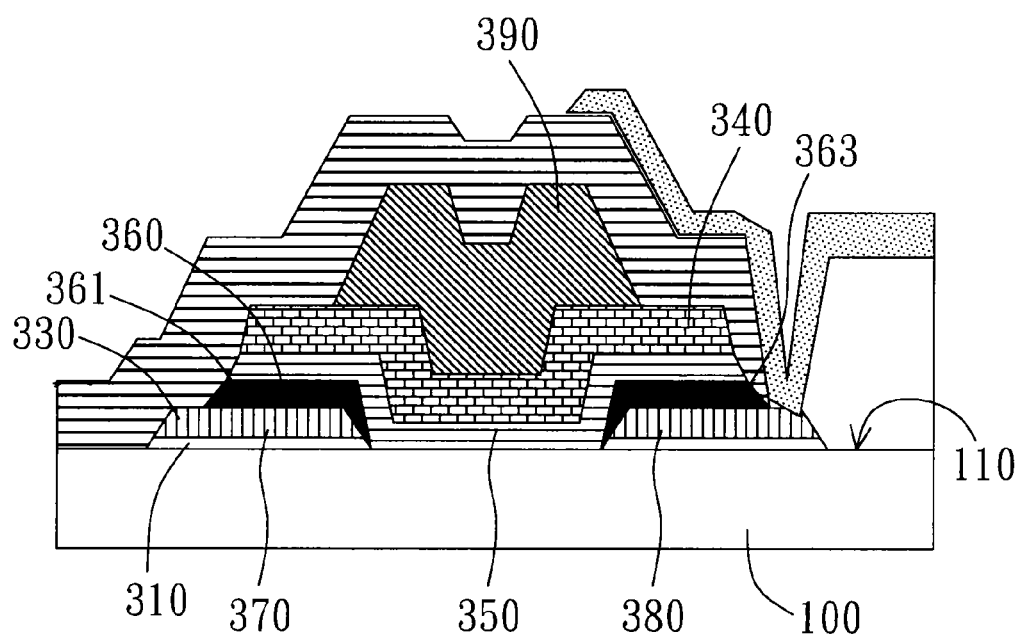
FIG. 4a is a view of an embodiment of the top gate design applied in a-Si TFT.

FIG. 4a is another embodiment of the present invention. The a-Si TFT is made of the top gate electrode design. As shown in FIG. 4a, the first interface layer 310 and the first conductive layer 330 are directly formed over the internal surface 110 of the substrate 100 to be the source electrode 370 and the drain electrode 380. After the etching process, there is a gap formed between the source electrode 370 and the drain electrode 380. The ohm contacted layer 360 includes a source ohm contacted layer 361 and a drain ohm contacted layer 363 and partially covers the source electrode 370 and the drain electrode 380. In the preferred embodiment, the ohm contacted layer is n+a-Si layer. The semiconductor layer 350 covers the source ohm contacted layer 361 and the drain ohm contacted layer 363. Furthermore, the semiconductor layer 350 covers the internal surface 110 of the substrate 100 exposed between the source ohm contacted layer 361 and the drain ohm contacted layer 363. In this preferred embodiment, the semiconductor layer 350 is a-Si layer and the isolated layer 340 covers the semiconductor layer 350. The isolated layer 340 is formed by oxygen silicon compound or nitrogen silicon compound. The gate electrode 390 is directly formed over the isolated layer 340 and is a deposited metal layer formed after etching.

Figure 4B:
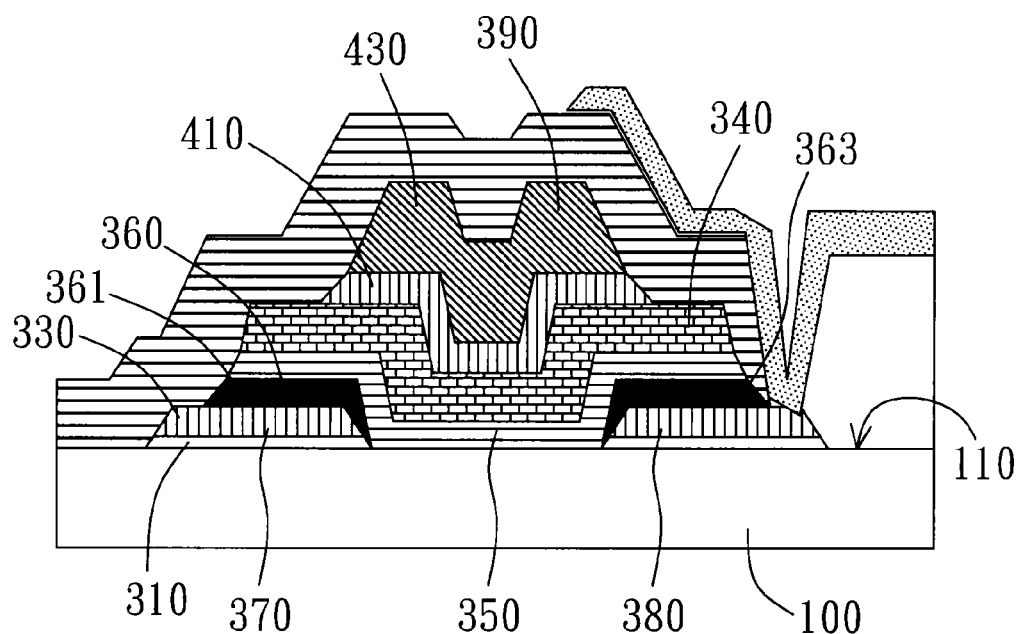
FIG. 4b is a view of another embodiment of the top gate design applied in a-Si TFT.

FIG. 4b is another embodiment of a-Si TFT made of the top gate design. In this embodiment, the gate electrode 390 includes the second interface layer 410 and the second conductive layer 430. The second interface layer 410 is formed over the isolated layer 340. The material of the second interface layer 410 includes copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture. The second conductive layer 430 is directly formed over the second interface layer 410. The material of the second conductive layer 430 is copper or copper alloy.

Figure 4C:
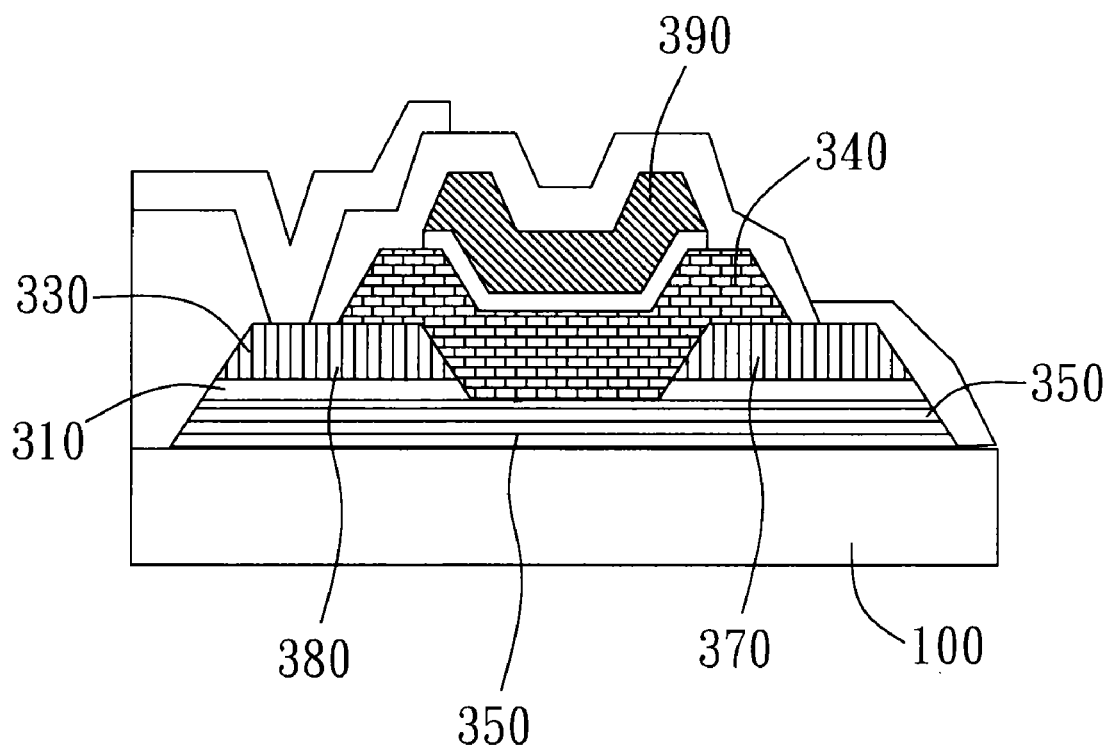
FIG. 4c illustrates of another embodiment applied in a-Si TFT.

In another embodiment, as shown in FIG. 4c, a semiconductor layer 350 is formed between the substrate 100 and the first interface layer 310. The semiconductor layer 350 is formed over the substrate 100. The semiconductor layer 350 is a-Si layer. The source ohm contacted layer 361 and the drain ohm contacted layer 363 are formed over the semiconductor layer 350. The source ohm contacted layer 361 is disposed between the semiconductor layer 350 and the source electrode 370. The drain ohm contacted layer 363 is disposed between the semiconductor layer 350 and the drain electrode 380. In the preferred embodiment, the source ohm contacted layer 361 and the drain ohm contacted layer 363 are n+a-Si layer. The isolated layer 340 partially covers the first conductive layer 330. In other words, the isolated layer 340 partially covers the top surface of the source electrode 370 and the drain electrode 380. The gate electrode 390 is formed over the isolated layer 340 and disposed between the source electrode 370 and the drain electrode 380.

Figure 5:
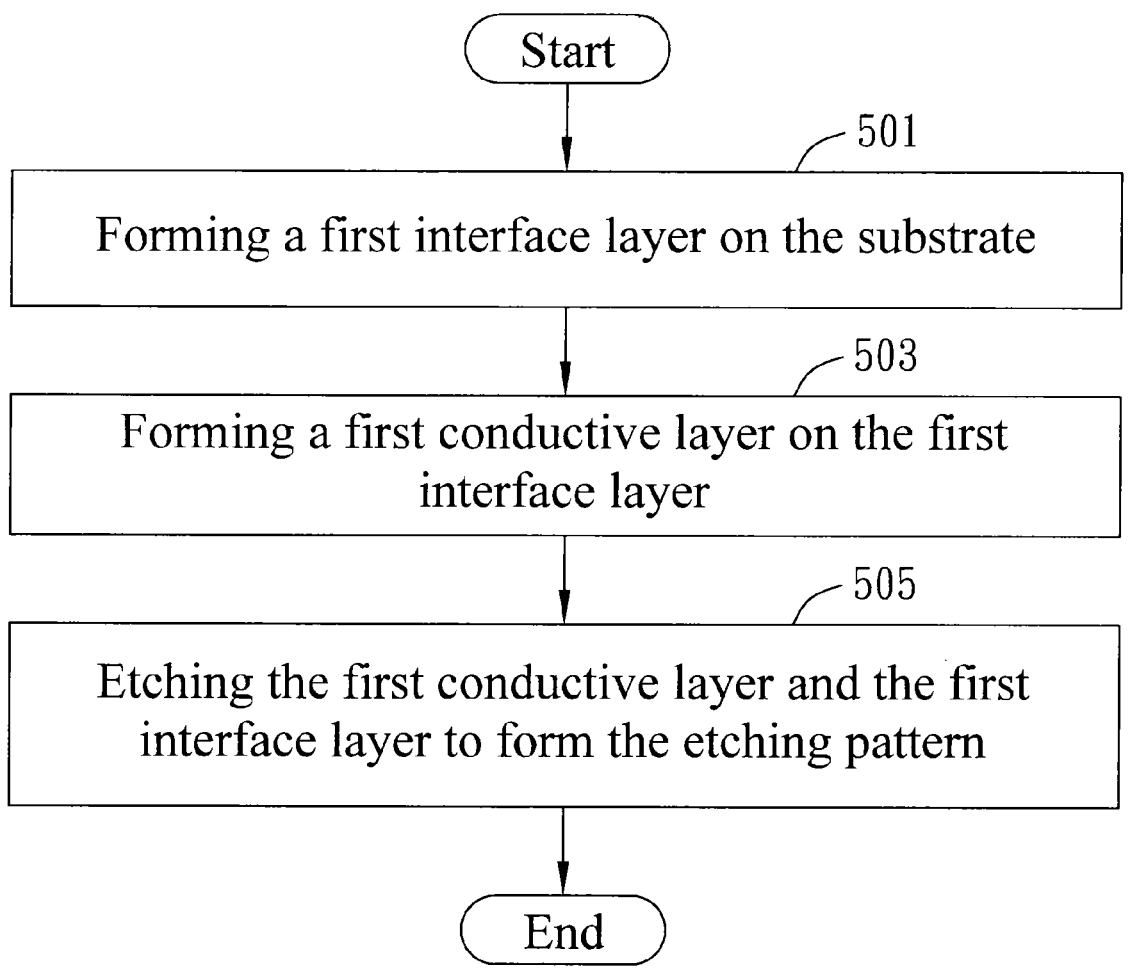
FIG. 5 shows a flowchart of an embodiment used in a manufacture method of the display panel in the present invention.

FIG. 5 is a flow chart showing the method for manufacturing the display panel structure and the circuit element. As shown in FIG. 5, the step 501 is to form a first interface layer 310 on the substrate 100. In this step, the PVD method, such as sputtering process, is used to form the first interface layer 310 on the substrate 100. In a different embodiment, the first interface layer 310 is formed by using CVD method or other methods. Besides, the first interface layer 310 is maintained within a thickness of 1 nm to 100 nm in step 501. In a different embodiment, the first interface layer 310 is further maintained within a thickness of 3 nm to 50 nm.

The material of the first interface layer 310 includes copper oxygen solid solution, copper nitrogen solid solution, copper nitrogen-oxygen solid solution, copper alloy oxygen solid solution, copper alloy oxygen-nitrogen solid solution, copper oxygen compound, copper alloy oxygen compound, copper nitrogen compound, copper alloy nitrogen compound, copper nitrogen-oxygen mixture and/or copper alloy nitrogen-oxygen mixture. Besides, in the preferred embodiment, the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. The percentage of copper included in copper alloy is more than 50 mol %. In the specific embodiment, the percentage of copper included in copper alloy is more than 90 mol %.

The step 503 is to form a first conductive layer 330 on the first interface layer 310. In this step, the PVD method, such as sputtering process, is used to form the first conductive layer 330 on the first interface layer 310. In a different embodiment, the first conductive layer 330 is formed over the first interface layer 310 by the CVD method or other method. Besides, the process method used in step 503 is the same as the method used in the step 501 to simplify the process procedure.

The material of the first conductive layer 330 is copper or copper alloy. The material formed the first interface layer 310 at least includes reactant or compound forming the material of the first conductive layer 330. In other words, the material formed the first interface layer 310 is made of reacting or compounding the material of the first conductive layer 330 with other elements. For example, when the first conductive layer 330 is made of copper, the first interface layer 310 is made of reacting or compounding copper with oxygen, nitrogen ion or mixture of oxygen and nitrogen Besides, in the preferred embodiment, the copper alloy described above is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. The percentage of copper included in copper alloy is more than 50 mol %. In the specific embodiment, the percentage of copper included in copper alloy is more than 90 mol %.

Step 505 is to etch the first conductive layer 330 and the first interface layer 310 to form the etching pattern. Because the material of the first interface layer 310 includes reactant or compound formed the first conductive layer 330, step 505 is to etch the first interface layer 310 and the first conductive layer 330 at the same time.

Figure 6:
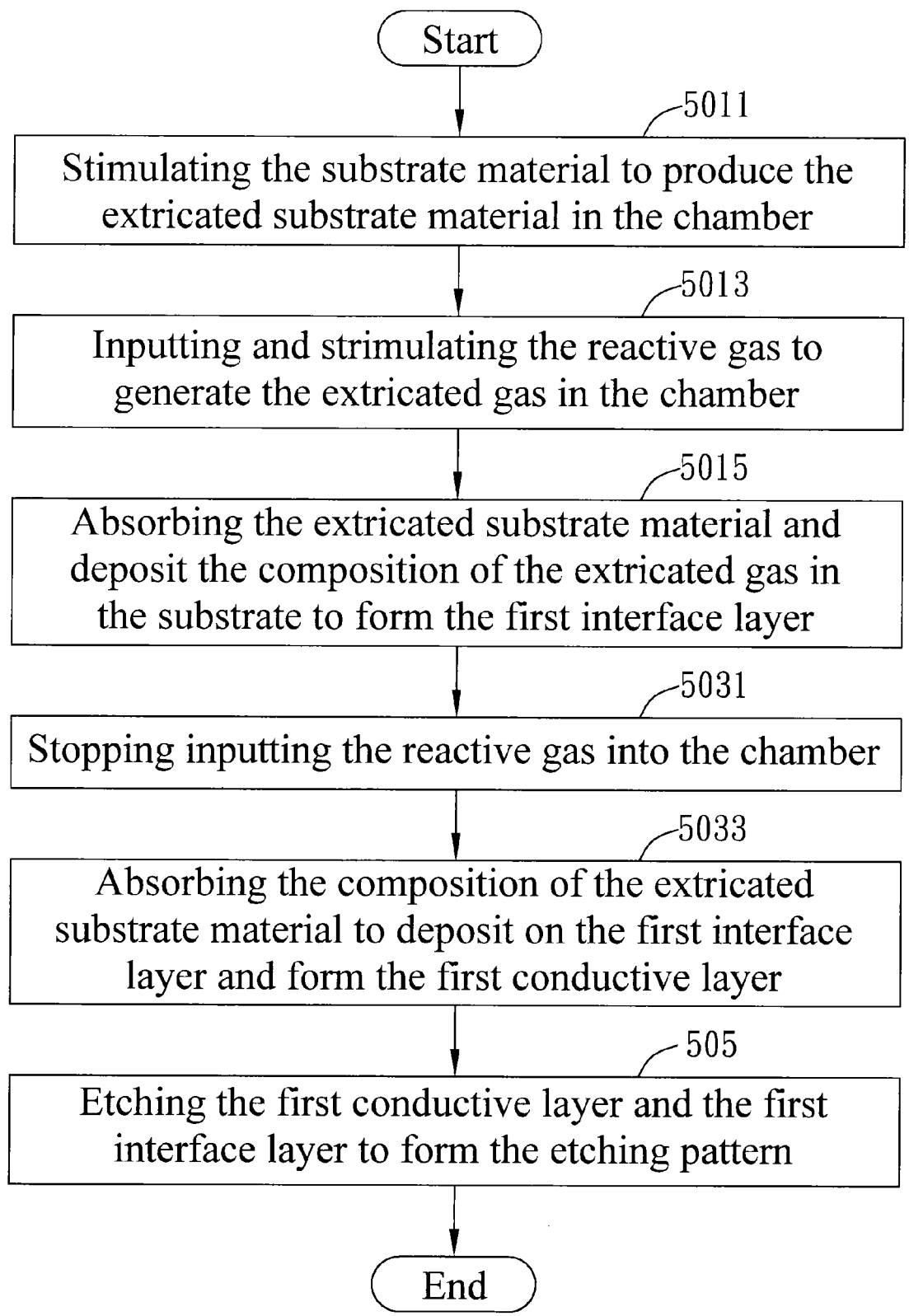
FIG. 6 shows a flowchart of another embodiment used in a manufacture method of the display panel in the present invention.

FIG. 6 is a flowchart of another embodiment of the manufacture method in the present invention. In this embodiment, the step 501 is to form the first interface layer 310, which includes several steps: step 5011 is to stimulate the substrate material to produce the extricated substrate material in the chamber. The substrate material is made of copper or copper alloy. In the preferred embodiment, the copper alloy includes copper, magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. The percentage of copper included in copper alloy is more than 50 mol %. In the specific embodiment, the percentage of copper included in copper alloy is more than 90 mol %.

Figure 7:
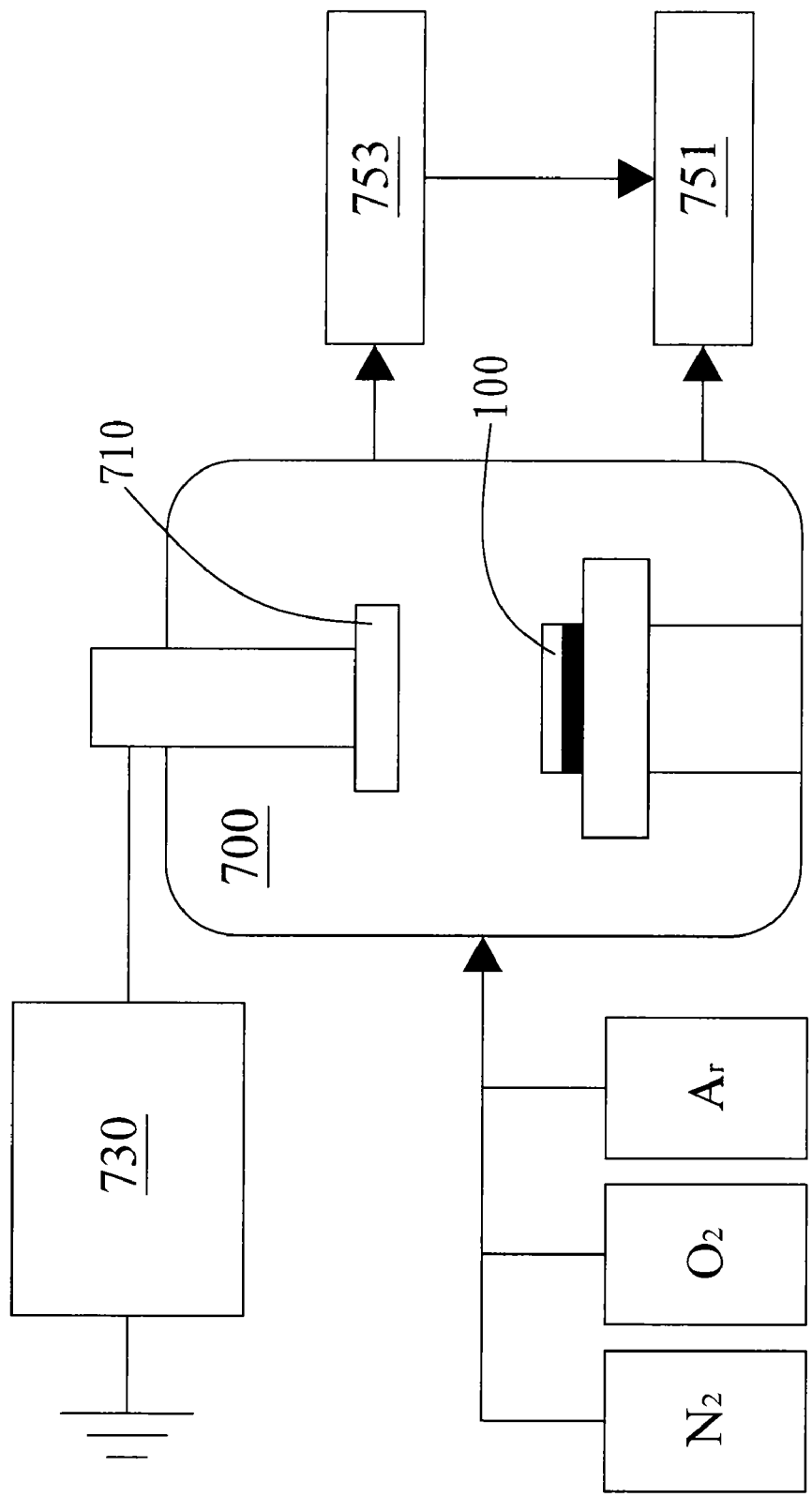
FIG. 7 illustrates a device applied in the manufacture method of the display panel in the present invention.

In the sputtering process, as shown in FIG. 7, the ions with high energy are used to hit the substrate material 710 to generate the extricated material. The argon is inputted in the chamber and is ionized to generate high energy ions in the embodiment shown in FIG. 7. In order to successfully proceed with the reaction, the mechanism bumper 751 and the diffused bumper 753 are used in the chamber 700 to generate a vacuum status. However, in the different embodiment, the thermal energy or electrical energy is used in the step 5011 to stimulate the substrate material to produce ion substrate material when the CVD method process or the plasma enhanced CVD method process is used.

Step 5013 is to input and stimulate the reactive gas to generate the extricated gas in the chamber 700. In the preferred embodiment, the reactive gas is nitrogen, oxygen or nitrogen-oxygen mixture. The sputtering process method shown in FIG. 7, the reactive gas inputted in the chamber is the mixture of nitrogen and oxygen gas. The reactive gas is stimulated to be extricated gas ion in the chamber 700 by the voltage inputted by the voltage generator 730. In the preferred embodiment, when the oxygen is used to be the reactive gas, the oxygen input pressure is about 1.3 mTorr. When the nitrogen is used to be the reactive gas, the nitrogen input pressure is about 3 mTorr.

Step 5015 is to attract the composition of the extricated substrate material and the extricated gas to be deposited onto the substrate 100 and form the first interface layer 310. In the preferred embodiment, the composition described above includes solid solution or compound formed by the extricated substrate material and the extricated gas, such as copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture. In the embodiment shown in FIG. 7, because the substrate 100 is disposed in the anodic position of the electric field of the chamber, the composition of the extricated substrate material and the extricated gas is attracted by the electric field to be deposited onto the substrate 100 and form the first interface layer 310.

In the embodiment shown in FIG. 6, the step to form the first conductive layer 330 includes two steps. The step 5031 is to stop inputting the reactive gas into the chamber 700. In the preferred embodiment, the step 5031 is used in the moment when the requested thickness of the deposition of the first interface layer 310 is achieved. The step 5033 is to attract the composition of the extricated substrate material to be deposited onto the first interface layer 310 and form the first conductive layer 330. In the step 5033, the extricated substrate material stimulated in the chamber 700 cannot react or compound with the reactive gas because the reactive gas is stopped inputting into the chamber 700. Therefore, the extricated substrate material will only be attracted to the electric field to be deposited onto the substrate 100 and form the first conductive layer 330.

Besides, when the adhesive force between the first conductive layer 330 and any other upper layers is needed to enhance, a sub interface layer is formed over the first conductive layer 330. For example, in the embodiment shown in FIG. 6, when the requested thickness of the first conductive layer 330 is formed in the step 5033, the reactive gas is inputted again to stimulate in the chamber 700. At this time, the reactive gas stimulated in the chamber 700 is reacting or compounding with the extricated substrate material. The composition of the extricated substrate material and the reactive gas is attracted to be deposited onto the first conductive layer 330 to form the sub interface layer.

As known in the flowchart of the embodiment of FIG. 6, only one substrate material 710 is used in the chamber 700 to form the first interface layer 310 or form the first conductive layer 330. Therefore, the complication of the manufacture process and the processed time can be improved because only one substrate material 710 is used to form the first interface layer 310 and the first conductive layer 330. Besides, when the oxygen input pressure is about 1.3 mTorr or the nitrogen input pressure is about 3 mTorr, the adhesive force between the first conductive layer 330 and the substrate 100 is about 220 Newton force.

Figure 8:
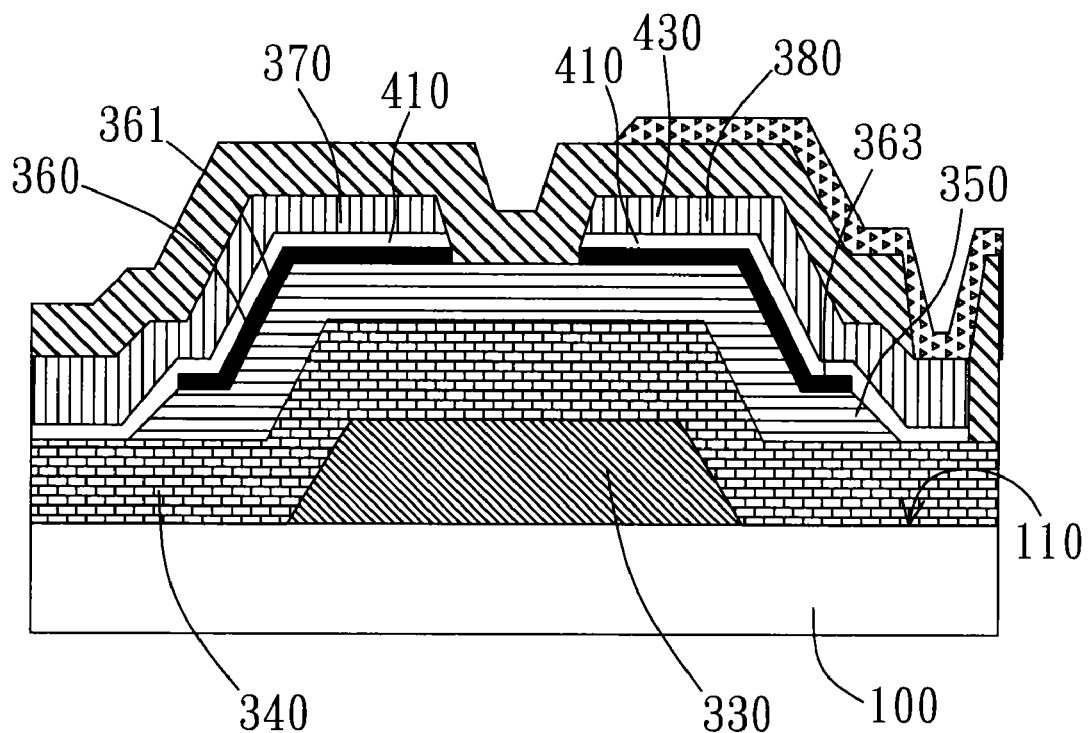
FIG. 8 illustrates another embodiment of a-Si TFT made of the bottom gate design in the present invention.

FIG. 8 is another embodiment of a-Si TFT made of the bottom gate design. In this embodiment, the etching pattern formed by the first conductive layer 330 is used to be the gate electrode of the circuit element 300. The source electrode 370 and the drain electrode 380 respectively include a second interface layer 410 and a second conductive layer 430. The second interface layer 410 is in the bottom of the source electrode 370 and the drain electrode 380 and formed over the ohm contacted layer 360. The material of the second interface layer 410 includes copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture and/or copper alloy nitrogen-oxygen mixture. Besides, in the preferred embodiment, the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of copper included in copper alloy is more than 50 mol %. In a different embodiment, the percentage of copper included in copper alloy is more than 90 mol %. The second interface layer 410 is electrically conducted or electrically insulated according to different materials and the percentages of the copper. The limitation of the thickness of the second interface layer 410 is close to the thickness of the first interface layer 310.

The second conductive layer 430 is directly formed over the second interface layer 410. The second interface layer 410 and the second conductive layer 430 are together formed an etching pattern. In the preferred embodiment, the second conductive layer 430 is formed over the second interface layer 410 by physical vapor deposition (PVD), such as sputtering process. In a different embodiment, the second conductive layer 430 is formed over the second interface layer 410 by chemical vapor deposition (CVD) or other method.

In the preferred embodiment, the material of the second conductive layer 430 is copper or copper alloy. The material of the second interface layer 410 at least comprises reactant or compound forms the second conductive layer 430. In other words, the material of the second interface layer 410 is formed by reacting or compounding the material of second conductive layer 430 with other elements. For example, as the second conductive layer 430 is made of copper, the second interface layer 410 is made of reacting or compounding copper with oxygen, nitrogen or mixture of oxygen and nitrogen. Because of the commonness of the materials of the second interface layer 410 and the second conductive layer 430, the etching step can etch the second interface layer 410 and the second conductive layer 430 at the same time. Besides, in the preferred embodiment, the material of the copper alloy is composed of copper and the metal includes magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium and/or iron. In the preferred embodiment, the percentage of copper included in copper alloy is more than 50 mol %. In a different embodiment, the percentage of copper included in copper alloy is more than 90 mol %.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A method for manufacturing a display panel structure comprising:
    forming an interface layer on a substrate, wherein materials of the interface layer include copper oxygen solid solution, copper nitrogen solid solution, copper nitrogen-oxygen solid solution, copper alloy oxygen solid solution, copper alloy nitrogen solid solution, copper alloy nitrogen-oxygen solid solution, copper oxygen compound, copper alloy oxygen compound, copper nitrogen compound, copper alloy nitrogen compound, copper nitrogen-oxygen mixture or copper alloy nitrogen-oxygen mixture;
    forming a conductive layer on the interface layer, wherein the materials of the conductive layer include copper or copper alloy, and the materials of the interface layer include one of reactant or compound of the conductive layer; and
    etching the conductive layer and the interface layer to form an etching pattern.

2. The method of claim 1, wherein the interface layer forming step further comprises:
    stimulating a substrate material in a chamber to generate an extricated material with copper or copper alloy;
    inputting and stimulating a reactive gas in the chamber to generate an extricated gas, wherein the reactive gas includes nitrogen, oxygen and nitrogen-oxygen mixture; and
    attracting a composition of the extricated material and the extricated gas to deposit on the substrate and form the interface layer; wherein the composition includes a solid solution or a compound formed by the extricated material and the extricated gas.

3. The method of claim 2, wherein the oxygen input pressure is more than 1.3 mTorr in the step of stimulating the reactive gas.

4. The method of claim 2, wherein the nitrogen input pressure is more than 3 mTorr in the step of stimulating the reactive gas.

5. The method of the display panel structure of claim 1, wherein the interface layer forming step further comprises using a physical vapor deposition (PVD) or a chemical vapor deposition (CVD) to form the interface layer on the substrate.

6. The method of the display panel structure of claim 1, wherein the conductive layer forming step further comprises using a PVD or CVD to form the conductive layer on the substrate.

7. The method of the display panel structure of claim 1, wherein the interface layer forming step further comprises controlling the interface layer with 1 nm to 100 nm thick.

8. The method of the display panel structure of claim 7, wherein the interface layer forming step further comprises controlling the interface layer with 3 nm to 50 nm thick.

9. The method of the display panel structure of claim 1, wherein the materials of the copper alloy comprises copper, magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium or iron.

10. The method of the display panel structure of claim 2, wherein the substrate material comprises copper, magnesium, chromium, titanium, calcium, niobium, manganese, tantalum, nickel, vanadium, hafnium, boron, aluminum, gallium, germanium, tin, molybdenum, tungsten, palladium, zinc, indium, silver, cobalt, iridium or iron.

* * * * *